(12) United States Patent
Alt

(10) Patent No.: US 8,379,775 B2
(45) Date of Patent: Feb. 19, 2013

(54) SELECTION OF A RECEIVED SEQUENCE BY MEANS OF METRICS

(75) Inventor: Daniel E. Alt, Royston (GB)

(73) Assignee: MStar Semiconductor, Inc., Grand Cayman (KY)

( * ) Notice: Subject to any disclaimer, the term of this patent is extended or adjusted under 35 U.S.C. 154(b) by 961 days.

(21) Appl. No.: 12/304,587

(22) PCT Filed: Jun. 21, 2007

(86) PCT No.: PCT/GB2007/002321
§ 371 (c)(1),
(2), (4) Date: Dec. 12, 2008

(87) PCT Pub. No.: WO2007/148100
PCT Pub. Date: Dec. 27, 2007

(65) Prior Publication Data
US 2009/0323868 A1 Dec. 31, 2009

(30) Foreign Application Priority Data
Jun. 22, 2006 (GB) .................................. 0612405.1

(51) Int. Cl.
*H03D 1/00* (2006.01)
*H04L 12/16* (2006.01)
*H04B 7/216* (2006.01)
(52) U.S. Cl. ......................... 375/343; 370/260; 370/342
(58) Field of Classification Search .................. 375/343; 370/260, 342
See application file for complete search history.

(56) References Cited

U.S. PATENT DOCUMENTS

| 4,240,156 | A | 12/1980 | Doland |
| 5,391,198 | A | 2/1995 | Cheney, III et al. |
| 6,199,186 | B1 | 3/2001 | Chen et al. |
| 7,693,563 | B2 * | 4/2010 | Suresh et al. ................. 600/407 |
| 2002/0042786 | A1 * | 4/2002 | Scarborough et al. .......... 706/21 |
| 2003/0115515 | A1 * | 6/2003 | Curtis et al. ................... 714/712 |
| 2003/0195706 | A1 * | 10/2003 | Korenberg ....................... 702/19 |
| 2004/0001428 | A1 * | 1/2004 | Datta et al. ...................... 370/208 |
| 2004/0215626 | A1 * | 10/2004 | Colossi et al. ................. 707/100 |
| 2005/0078614 | A1 * | 4/2005 | Haartsen ....................... 370/260 |
| 2005/0078648 | A1 * | 4/2005 | Nilsson ......................... 370/342 |
| 2005/0180344 | A1 * | 8/2005 | Sternberg et al. ............. 370/310 |

FOREIGN PATENT DOCUMENTS

WO 00/67386 11/2000
WO 2005/041465 5/2005

OTHER PUBLICATIONS

"Performance of the HS-SCCH", 3GPP TSG-RAN WG1#25, Paris, France, Apr. 9-12, 2002, pp. 1-12, XP-002301041.

* cited by examiner

*Primary Examiner* — David C. Payne
*Assistant Examiner* — Sarah Hassan
(74) *Attorney, Agent, or Firm* — Edell, Shapiro & Finnan, LLC

(57) ABSTRACT

A method of received data sequence assessment, the method comprising producing a correlation metric describing the fit to a received sequence of the most likely of a set of candidates for the received sequence and calculating an error metric indicative of discrepancies between the received sequence and its most likely candidate.

4 Claims, 1 Drawing Sheet

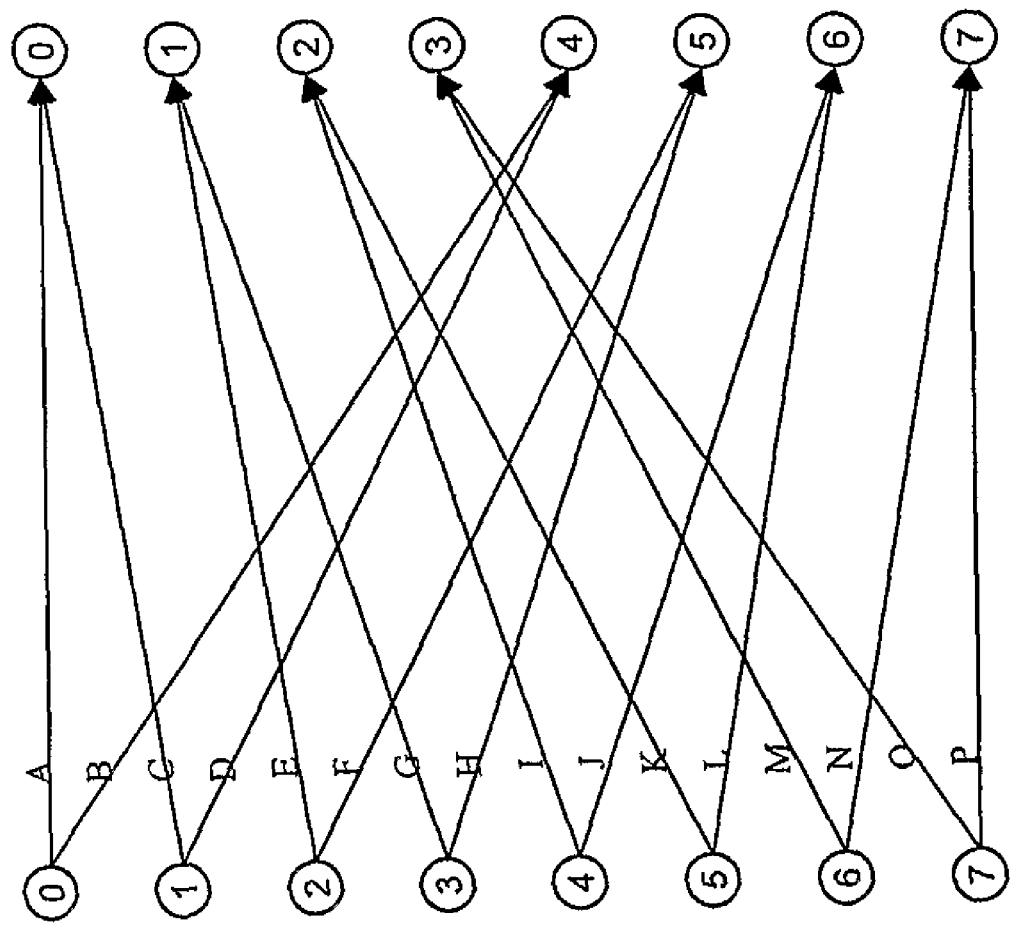

SELECTION OF A RECEIVED SEQUENCE BY MEANS OF METRICS

FIELD OF THE INVENTION

The present invention has application to 3GPP HSDPA systems and other communications systems.

BACKGROUND

In order to know whether data is to be received on the HS-DSCH data channel, the UE needs to decode the HS-SCCH channel(s). The HS-SCCH channels are shared between different users in the downlink. The receiver needs to identify if any of the HS-SCCH channels transmitted by the Node B is intended for the UE.

A preliminary decision must be made after the first slot ('part 1') of the HS-SCCH three-slot sub-frame, so that HS-DSCH reception can start if necessary. Since the CRC is only included in HS-SCCH part 2 (the second and third slots of the sub-frame), another method must be used to identify which, if any, of the received HS-SCCH channels are intended for the UE. The UE Identifier is encoded with the part-1 data so that good decoding results should be achieved only for HS-SCCH channels directed to the UE in question.

SUMMARY OF THE INVENTION

According to one aspect, the invention provides a method of assessing a received data sequence, the method comprising producing a correlation metric describing the fit to the received sequence of the most likely of a set of candidates for the received sequence and calculating an error metric indicative of discrepancies between the received sequence and said most likely candidate.

In certain embodiments, the received data sequence is a symbol rate or despread HS-SCCH channel in an HSDPA receiver.

A group of received data sequences can be processed in this manner, to produce for each a correlation metric describing the fit of the most likely of a set of candidates for the respective received sequence and also an error metric indicative of discrepancies between the received sequence concerned and its most likely candidate. In certain embodiments, the correlation and error metric pair for each received sequence in the group can be used to make judgments about the received sequences in the group. For example, the correlation and error metric pairs can be used to select one of the received sequences in the group such that a data signal associated with the selected sequence becomes the object of additional signal processing. In terms of HSDPA, the correlation and error metric pairs may be used to select an HS-SCCH channel such that its associated HS-DSCH channel is then decoded to download data into the system (e.g. a cellular handset) in which the invention is deployed.

The process of selecting a received sequence from a group of received sequences for each of which a correlation and error metric pair has been calculated can vary from one embodiment to another. For example, received sequences can be eliminated from the selection process if their error metrics are worse than a benchmark with one of the surviving received sequences being selected on the basis of having the best correlation metric amongst the survivors. In one variant, the received sequence with the best correlation metric in the group is selected tentatively with that selection being confirmed if the error metric of that received sequence betters a given benchmark.

In certain embodiments, the production of a correlation metric describing the fit to a received sequence of the most likely candidate for that sequence is achieved by processing the received sequence through an error correcting algorithm. For example, a Viterbi algorithm could be used. A trellis type error correcting algorithm such as a Viterbi algorithm represents a received sequence as a series of stages, each stage having states interconnected by branches, and state metrics being calculated for the trellis states. In the case where a Viterbi algorithm is used, the state having the best state metric in the final stage of the trellis is judged to be the state specifying the end of the most likely candidate for the received data sequence and the state metric of that state is determined to be the correlation metric describing the fit between the received sequence and that candidate.

In certain embodiments, the error metric indicative of discrepancies between a received data sequence and its most likely candidate is a bit error rate or count.

In the case where a trellis algorithm is used to identify the most likely candidate for a received data sequence, discrepancy metrics may be built up for the states in the trellis as the algorithm progresses through the trellis. By way of example, the discrepancy metric of a state in the trellis could be updated by adding to the metric of the state from which the successful branch leads, a value indicative of the discrepancy between the data represented by the successful branch leading into that state and the part of the received data sequence whose reception corresponds to the trellis stage in question. A discrepancy metric for a trellis state could, for example, be the number of bit mismatches between the sequence of successful branches leading from the beginning of the trellis to that state at the current trellis stage and the parts of the received data sequence corresponding to those branches.

In a certain embodiment, a number of data sequences are received and each is potentially an HSDPA HS-SCCH channel that is directed to the system (e.g. a cellular handset) in which the invention is operating. Those sequences are then passed through a Viterbi decoder to deduce a most likely candidate for each of them. For each of these received data sequences, the best state metric at the final stage of the trellis processed by the Viterbi decoder is deemed to be the correlation metric and indicates the most likely candidate for the received sequence, which candidate is read by tracing back through the trellis from that state. During the process of progressing through the trellis to build up the state metrics, discrepancy metrics are also built up for the states. For a given stage in the trellis, the discrepancy metric is updated by determining the number of bits in the bit sequence corresponding to the successful branch leading into that state that do not match corresponding bits of the part of received data signal that corresponds to the current trellis stage and then adding the number so deduced to the discrepancy metric of the state from which the successful branch originates. At the end of the trellis, the discrepancy metric of the state specifying the most likely candidate for a received data sequence is then deemed the error metric for that sequence. Of the group of potential HS-SCCH channels, that with the best correlation metric and error metric combination is judged to be an HS-SCCH whose HS-DSCH channel should be decoded. If all correlation metric and error metric combinations are too poor (for example, if either or both metrics fall below a threshold for every HS-SCCH), it may be decided that no HS-DSCH should be decoded. In one variant, the correlation metrics are normalised (based, for example, on the sum of the absolute values of the input data) to remove the bias in favour of HS-SCCH channels transmitted with higher power.

Some features of an embodiment in the domain of HSDPA will now be discussed.

In this embodiment, two different metrics to assess the quality of the decoding results for part 1 of each received HS-SCCH and select one or none for further processing (other metrics may also be possible).

One of these metrics is the maximum correlation between the received HS-SCCH part-1 soft decision sequence and all possible transmitted sequences. This metric can be calculated, for example, by selecting the best path metric calculated by a Viterbi decoder for the HS-SCCH part-1 convolutional code. This metric may or may not be normalised by the mean absolute value of the soft decisions to compensate for the bias that will be introduced when different HS-SCCH channels have different powers.

The other of these metrics is the estimated number of raw bit errors in the encoded HS-SCCH part-1 data. This metric can be calculated, for example, by comparing the signs of the soft decisions with the encoded bits produced by a Viterbi decoder during its operation, either as it is calculating branch and path metrics or at the end during trace-back processing.

Deciding which, if any, of these HS-SCCH channels is directed to the UE can be done in two steps. One step is to select the received HS-SCCH that is most likely to be directed to the UE and the other is to decide whether a specific HS-SCCH is directed to the UE. Both steps allow computational complexity to be reduced: the former by selecting just one HS-DSCH transport channel to be received, and the latter by not decoding HS-SCCH part 2 and/or not receiving and decoding HS-DSCH for an unpromising HS-SCCH part 1. These steps can be applied in either order, selecting the best candidate HS-SCCH and then deciding whether it is directed to the UE, or eliminating the HS-SCCH channels that appear not to be directed to the UE and then selecting the best of the remaining ones (or none if all are eliminated). Different metrics can be used for these two decisions. Simulations have shown that the maximum-correlation metric is better for selecting the received HS-SCCH most likely to be directed to the UE, while the bit-error-rate metric is better for deciding whether a specific HS-SCCH is directed to the UE. The maximum-correlation metric is calculated from several information bits per data bit, and therefore has more precise information than the bit-error-rate metric, which is calculated from only one information bit per data bit. This more precise information makes the maximum-correlation metric better for comparing the quality of two HS-SCCH channels. This is essentially the same reason that the Viterbi decoder makes its decisions based on correlations rather than bit errors. However, the bit-error-rate metric is independent of the amplitude of the input data, so it can be more reliably compared against a fixed threshold to determine whether an HS-SCCH is likely to have been directed to the UE.

In the aspect of the invention discussed so far, a correlation metric and an error metric are determined for the or, as the case may be, each received signal that is being assessed. According to another aspect of the invention, the error metric is not employed and the correlation metric, in a normalised form, may then be used as the metric in tests similar to those to which the correlation metric and the error metric were subjected in the discussion of the preceding aspect of the invention. For example, the normalised correlation metrics of a group of received signals can be compared against a threshold in one test and the best normalised correlation metric can be selected from a group of such metrics in another test.

Although the foregoing paragraphs describe aspects of the invention primarily in terms of a method it will of course be apparent to the skilled person that software and hardware capable of carrying out such a method can readily be implemented. The present invention extends to such alternative embodiments.

BRIEF DESCRIPTION OF THE DRAWING

By way of example only, certain embodiments of the present invention will now be described by reference to the accompanying drawings, in which:

FIG. 1 is a drawing of one stage of a Viterbi trellis diagram, with a letter labeling each branch and with a number labeling each state.

DETAILED DESCRIPTION

In the present embodiment, the Viterbi decoder for HS-SCCH part 1 produces two metrics with each decoding result.

The first is the maximum correlation of the received sequence of soft decisions against all possible transmitted sequences of bits, which is the final path metric of the Viterbi decoder. The second is the estimated number of raw bit errors, which the Viterbi decoder calculates by counting for each branch the mismatches between the signs of the soft decisions and the estimated transmitted bits. As the paths are built up, these branch error counts are accumulated (in the same way as the branch metrics), producing a final error count for the winning path (just as a final path metric is produced).

FIG. 1 is a simplified trellis stage of the HS-SCCH Viterbi decoder; the actual trellis has 256 states rather than the 8 shown. As is usual for a Viterbi decoder, the best-path selection is done based on the correlation value, which is the first of the two metrics. The following discussion will use the branch labels of this figure, and assumes three received soft decisions (corresponding to three transmitted bits) for each trellis stage. Further assume that the three received soft decisions are +3, −2, and −3 and that the transmitted bits associated with branches A, C, H, and P are 000, 010, 011, and 111, respectively. Note that a positive soft decision represents a 0 bit and a negative soft decision represents a 1 bit, so the bit pattern corresponding to these three soft decisions is 011.

Given these conditions, the correlation metrics for these four branches are:

A: (+3)+(−2)+(−3)=−2

C: (+3)−(−2)+(−3)=+2

H: (+3)−(−2)−(−3)=+8

P: −(+3)−(−2)−(−3)=+2 and the error metrics are:

A: 2 (the expected signs are +++, while the actual signs are +−−)

C: 1 (the expected signs are +−+, while the actual signs are +−−)

H: 0 (the expected signs are +−−, while the actual signs are +−−)

P: 1 (the expected signs are −−−, while the actual signs are +−−)

As the trellis is traversed, both sets of metrics are accumulated for the winning paths and branches. In this example, if branch A is selected as the best to state 0, the new correlation metric for state 0 is the old one for state 0 plus the correlation metric for branch A (−2) and the new error metric for state 0 is the old one for state 0 plus the error metric for branch A (2). If branch C is selected as the best to state 0, the new correlation metric for state 0 is the old one for state 1 plus the correlation metric for branch C (+2) and the new error metric for state 0 is the old one for state 1 plus the error metric for branch C (1). As is usual in Viterbi decoders, the best branch to a given state is the one that produces the highest new correlation metric for that state. In this case, if the old correlation metrics were 3 for state 0 and 1 for state 1, branch C would be selected because the resulting new correlation metric is larger for branch C (1+2=3) than for branch A (3−2=1).

An additional piece of logic may or may not be provided to accumulate the absolute values of the soft decisions at the input to the Viterbi decoder. This estimated signal strength can be used to compensate for power differences between HS-SCCH channels, by removing the bias in favour of higher-powered channels that exists in the raw correlation. This bias removal could be done by dividing each correlation by the associated estimated signal strength, or by multiplying each correlation by the estimated signal strength associated with the other correlation when comparing pairs of correlations.

The maximum-correlation metric is used to select the HS-SCCH part 1 that is most likely to have been directed to the UE. The HS-SCCH part 1 with the largest correlation (after the optional normalisation to account for signal strength) is selected as the best candidate.

The raw-bit-error-rate metric is used to determine whether a specific HS-SCCH part 1 was directed to the UE. The raw bit-error rate metric is compared with a threshold and if the value of that metric lies below that threshold, it is concluded that the HS-SCCH part 1 under test is potentially directed to the UE. Conversely, if the value of the raw bit-error rate metric lies on or above the threshold, it is concluded that the HS-SCCH part 1 under test is not directed to the UE. The decoded part-1 information also contributes to this decision-making process: certain combinations of values are never used or may be inconsistent with the UE's capabilities, and the presence of such a combination clearly indicates that that HS-SCCH was not directed to the UE.

These two decisions can be applied in either order. The UE can first compare correlation values to select the most likely HS-SCCH part 1 and then use the raw bit-error rate (with consistency checks on the decoded data) to decide whether that HS-SCCH was probably directed to the UE. Alternatively, the UE can first use the raw bit-error rate (with consistency checks on the decoded data) to eliminate each HS-SCCH that was probably not directed to the UE and then compare correlations to select the remaining HS-SCCH most likely to have been directed to the UE.

Either order will work, but the second is to be preferred. The second method can eliminate every HS-SCCH at the first step, in which case the second step will be skipped and some computations can be eliminated. More importantly, the second method immediately discards any HS-SCCH part 1 with too poor an estimated bit-error rate, thus eliminating the possibility of selecting a bad part 1 because it has a larger correlation than the part 1 that is actually directed to the UE, and then decoding no HS-DSCH because the selected HS-SCCH has too many bit errors.

Consider the case where one HS-SCCH is directed to the UE and its part 1 is decoded correctly with an acceptably low error rate, while another HS-SCCH part 1 produces an unacceptably high estimated error rate with a correlation higher than that for every other HS-SCCH part 1. The first order, in this case, would select the HS-SCCH part 1 with the largest correlation, and then discard it because of its high error rate. The second order, on the other hand, would discard every HS-SCCH part 1 with too high an error rate before comparing correlations, thus allowing the correct part 1 to be selected. This case is rare, but has been observed in simulation. The second method should therefore provide slightly (though not significantly, if the error-rate threshold is chosen correctly) better performance than the first.

A third comparison method is also possible, based on the second comparison order. If one or more error metrics are below the threshold, the correlation-metric comparison considers only HS-SCCH channels with error metrics below the threshold. If, however, no error metrics are below the threshold, all HS-SCCH channels are considered (except those with inconsistent data). This could be further refined by the use of a second, higher, bit-error threshold. If no error metrics are below the first threshold then the second one is used, with correlation-metric comparison considering only those HS-SCCH channels with error metrics below the second threshold. If no error metrics are below the second threshold, then no HS-DSCH is decoded.

The embodiments described so far feature an optional process for normalising the correlation metric of an HS-SCCH part 1 under test. In another embodiment, the correlation metric thus normalised is used to the exclusion of the raw bit-error rate metric as will now be described. Since the normalisation removes the dependency of the correlations on the amplitude of the input data, normalised correlations can be reliably compared against a fixed threshold. The extra information contained in the normalised correlations, as compared to the bit-error-rate metrics, may produce better results and allow more precise setting of the threshold level.

For each of a number of HS-SCCH part 1 blocks, the normalised correlation metric is calculated. Two tests are applied to this group of normalised correlation metrics. First, the largest metric is identified in the group and then it is determined whether that metric exceeds a threshold. If it does, then the corresponding HS-SCCH part 1 is deemed to be directed to the UE. If it does not, then it is deemed that none of the HS-SCCH part 1 blocks are directed to the UE. Of course, these two tests can be applied in the reverse order, in which case it is first determined which of the normalised correlation metrics exceed the threshold and then the largest of those that do is taken to indicate an HS-SCCH directed to the UE. Because both tests use the same metric, either order will produce the same result. If the best normalised correlation of the group fails to exceed the threshold, then every normalised correlation of the group will be below the threshold.

What is claimed is:

1. A method of received data sequence assessment on a user equipment device, the method comprising (1) producing, for each of one or more received data sequences, a correlation metric describing the fit to a respective received sequence of the most likely of a set of candidates for the received sequence and (2) calculating an error metric indicative of discrepancies between the respective received sequence and its most likely candidate, the method further comprising comparing the error metrics to a threshold to determine which of the received sequences has an error metric below the threshold and determining which of the received sequences having an error metric below the threshold has the best correlation metric, characterized in that if none of the received sequences has an error metric below the threshold the correlation metrics of all of the received sequences are inspected to determine which of the received sequences has the best correlation metric, wherein the received sequence is a HS-SCCH channel and the error metric is a bit-error rate.

2. A method according to claim 1, further comprising opting to perform signal processing operations on a signal associated with the received sequence having the best correlation metric if the error metric of the received sequence having the best correlation metric is below the threshold or if no received sequence has an error metric below the threshold.

3. A method according to claim 1, wherein correlation metrics are compared to one another in a manner avoiding bias due to differing power levels in communications providing the received sequences by comparing correlation metrics that are normalized in terms of the estimated signal strength of the underlying received sequences.

4. A method according to claim 3, wherein the normalization is achieved through multiplying the correlation metrics to be compared by each other's corresponding received sequence's estimated signal strength.

* * * * *